(12) United States Patent
Dasari et al.

(10) Patent No.: US 8,140,937 B2
(45) Date of Patent: Mar. 20, 2012

(54) MEMORY INITIALIZATION TIME REDUCTION

(75) Inventors: Shiva R. Dasari, Austin, TX (US); Sudhir Dhawan, Austin, TX (US); Joseph Allen Kirscht, Rochester, MN (US); Jennifer L. Vargus, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 1112 days.

(21) Appl. No.: 11/969,449

(22) Filed: Jan. 4, 2008

(65) Prior Publication Data

US 2009/0177946 A1    Jul. 9, 2009

(51) Int. Cl.
    *G11C 29/00*    (2006.01)
(52) U.S. Cl. ......................... 714/763; 714/766
(58) Field of Classification Search .................. 714/763, 714/764, 766
    See application file for complete search history.

(56) References Cited

U.S. PATENT DOCUMENTS

| | | | |
|---|---|---|---|
| 7,032,158 B2 * | 4/2006 | Alvarez et al. | 714/763 |
| 7,065,688 B1 * | 6/2006 | Moyes et al. | 714/718 |
| 7,676,728 B2 * | 3/2010 | Resnick et al. | 714/764 |
| 2005/0216721 A1 * | 9/2005 | Zimmer et al. | 713/2 |

\* cited by examiner

*Primary Examiner* — James C Kerveros
(74) *Attorney, Agent, or Firm* — Robert R. Williams

(57) ABSTRACT

A method and apparatus to improve memory initialization in a memory of a computer system. Memory units in the memory comprise a plurality of ranks, each rank having a unique rank select. A parity generator outputs a parity bit corresponding to whether an encoded rank select has an even or odd number of "1"s. The parity bit is used by an Error Checking and Correcting (ECC) unit that generates ECC bits that are stored in a rank having an active rank select. During a first interval in a memory initialization period, ranks having an even number of "1"s in their encoded rank select are initialized in parallel. During a second interval in the memory initialization period, ranks having an odd number of "1"s in their encoded rank select are initialized in parallel.

10 Claims, 5 Drawing Sheets

US 8,140,937 B2

MEMORY INITIALIZATION TIME REDUCTION

FIELD OF THE INVENTION

This invention relates generally to memory controllers in computer systems. More particularly this invention relates to reducing time required to initialize memory.

SUMMARY OF EMBODIMENTS OF THE INVENTION

Many modern computer systems comprise a processor, a memory, and a memory controller. The memory controller receives requests from the processor for reads from the memory and for writes to memory. Typically, large modern computer systems are configured with a large amount of memory, often hundreds of gigabytes. A modern computer system designed for high reliability application includes some type of error checking and correcting (ECC) unit in the memory controller. An error checking and correcting unit checks data read from memory and corrects one or more errors in the data read, depending upon implementation. Without an ECC unit, a single, perhaps transient, error in data stored in memory, or transmitted from memory would cause a failure in the computer system if simple parity is used, or, worse, corrupt data being used by the processor.

The memory is configured having one or more memory units, for example, a dual inline memory module (DIMM). Each memory unit may have one or more memory ranks. A memory rank is selected by a rank select. For a particular memory unit having a plurality of memory ranks, and therefore, a plurality of rank selects, only one rank select of the plurality of rank selects may be active for any particular functional read or write, where a functional read or write is responsive to a read request or a write request issued by the processor. Each memory rank may further comprise a number of banks of memory.

During startup of the computer system, the memory must be initialized, and in some implementations, tested. A significant amount of time is spent initializing all data in each bank of each memory rank of each memory unit.

In an embodiment of the invention, parity of an encoded rank select is used by an ECC unit to improve reliability and diagnostic capability of the computer system. In an initialization mode, multiple memory ranks in a memory unit sharing a same parity of the encoded rank select are initialized at the same time.

DETAILED DESCRIPTION OF THE EMBODIMENTS

In the following detailed description of embodiments of the invention, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Figure 1:
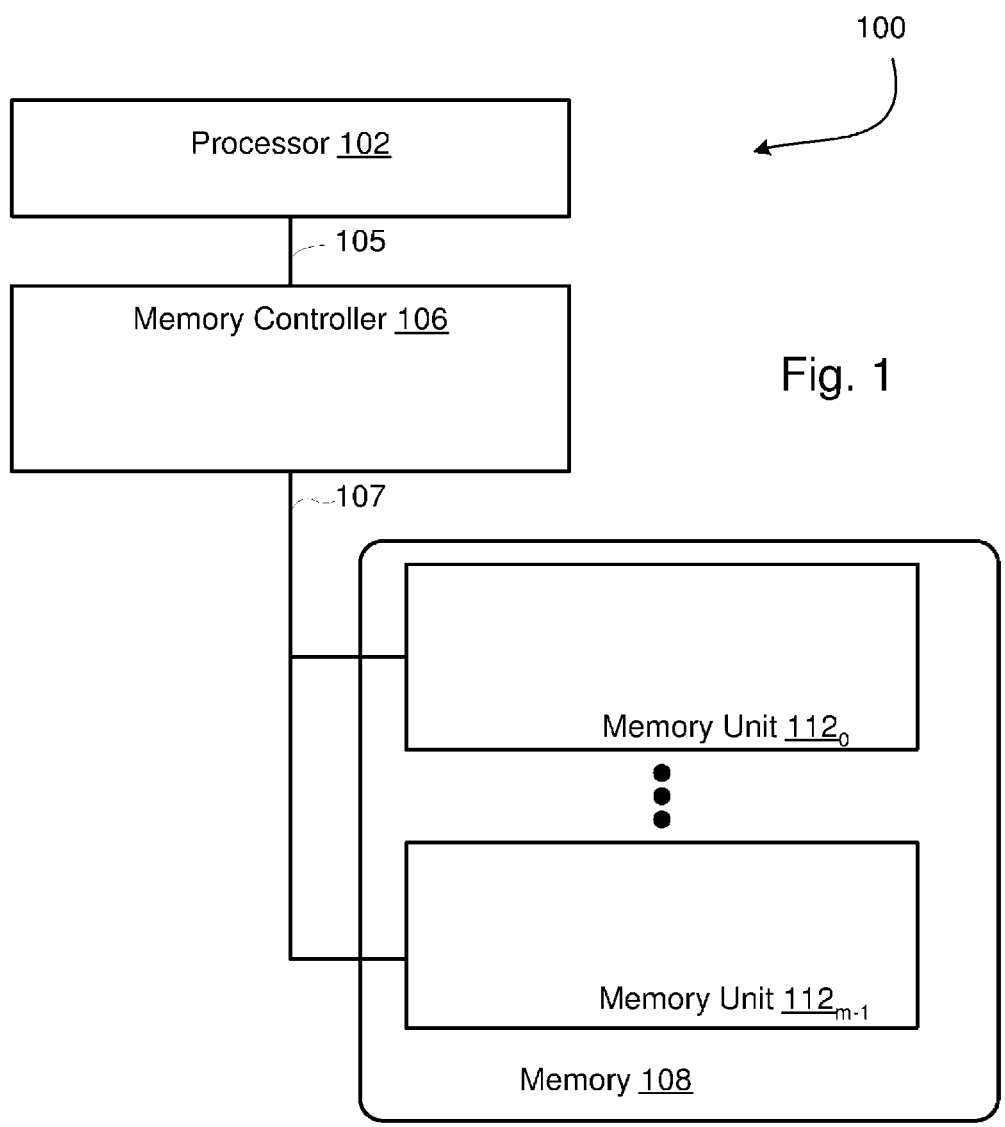
FIG. 1 is a block diagram of a computer system comprising a processor, a memory controller and a memory having one or more memory units, each memory unit having a plurality of ranks of memory.

With reference now to the drawings, and, in particular, FIG. 1, computer system 100 is shown. Computer system 100 comprises one or more processor(s) 102, a processor bus 105 that couples processor 102 to a memory controller 106, and a memory 108 coupled to memory controller 106 by a memory bus 107. Memory controller 106 may be included in processor 102 in some implementations. Memory 108 further comprises a plurality of memory units 112, (memory units $112_0$-$112_{m-1}$). In current memory technology, memory units 112 are typically implemented as dual inline memory modules (DIMMs). Memory 108 is initialized by making a number of initialization writes to memory 108 during an initialization period.

A typical modern computer system 100 further includes many other components, such as networking facilities, hard disks and disk controllers, user interfaces, and the like, all of which are well known and discussion of which is not necessary for understanding of embodiments of the invention.

Figure 2:
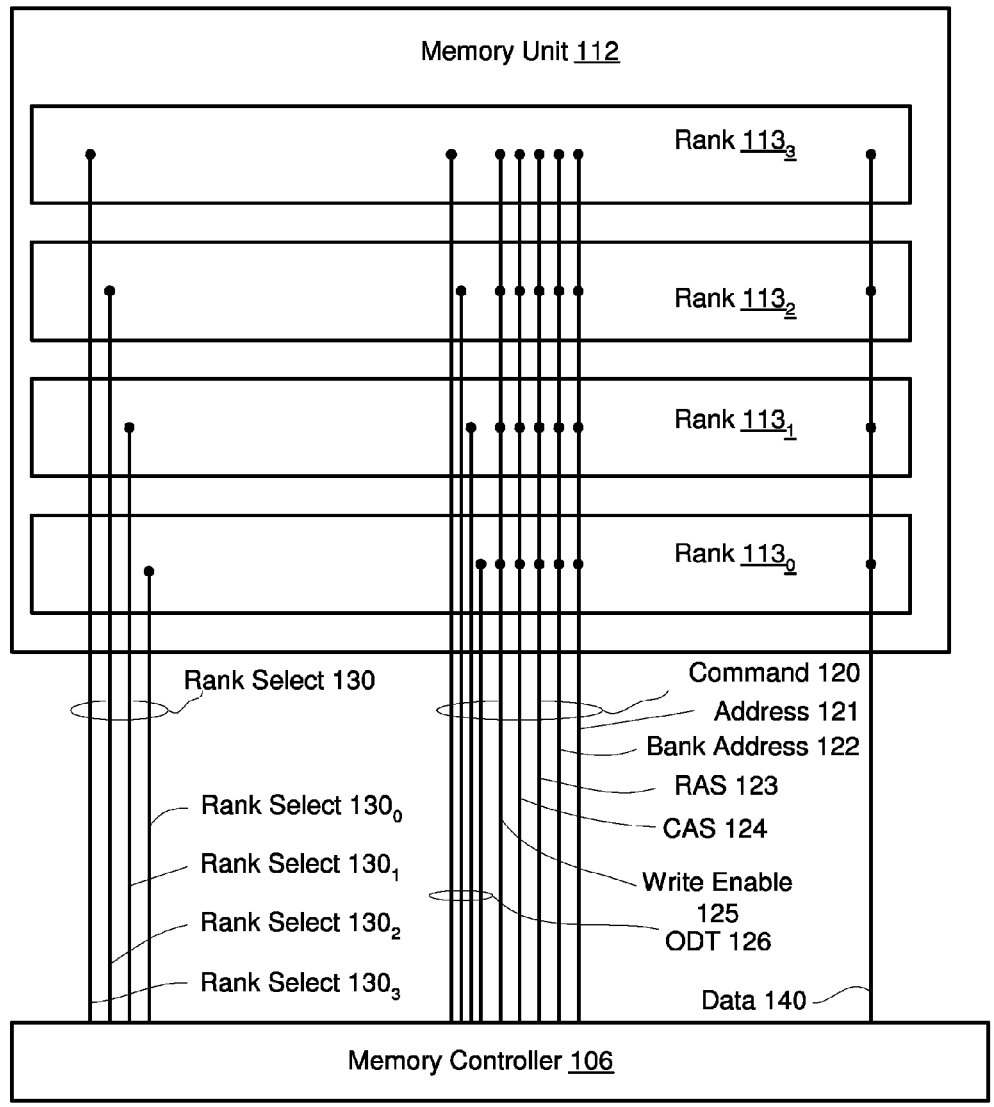
FIG. 2 is a block diagram of a memory controller showing detail of wiring interconnects between ranks of memory and the memory controller.

Turning now to FIG. 2, memory controller 106 is shown connected to a memory unit 112, the memory unit 112 further comprising four memory ranks 113 (ranks $113_0$-$113_3$). During functional reads and writes (i.e., reads and writes satisfying read or write requests from the processor), only one memory rank is selected at a particular time. Memory controller 106 selects memory ranks with a rank select 130. Active signals on rank select $130_0$, $130_1$, $130_2$, and $130_3$, respectively, select memory ranks $113_0$, $113_1$, $113_2$, and $113_3$. Memory controller 106 transmits command 120, which is coupled to each memory rank 113 on memory unit 112. Command 120 further comprises address 121, bank address 122, RAS (Row Access Strobe) 123, CAS (Column Access Strobe) 124, write enable 125 and ODT (On-Die Termination) 126. Memory controller 106 is further coupled to each rank 113 in memory unit 112 by data 140 over which data is transmitted to ranks 113 from memory controller 106 or transmitted from a rank 113 to memory controller 106. Rank select 130, command 120 and data 140 are signal conductors in memory bus 107. In various implementations, additional control signals may be used. For example, some implementations use a CKE (clock enable) signal that is active during self refresh or power saving mode.

Figure 3:
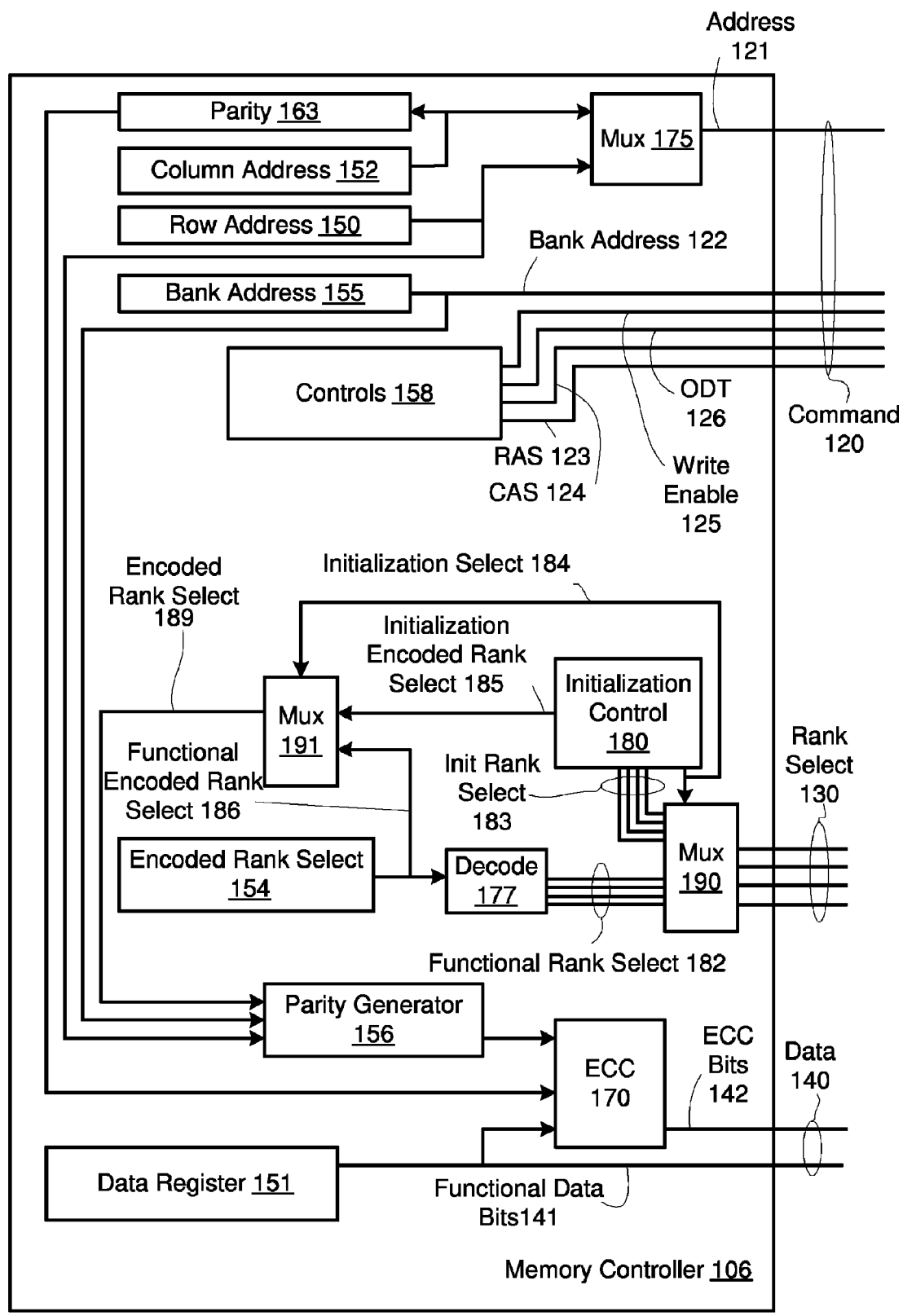
FIG. 3 is a block diagram of a memory controller, showing details therein.

Turning now to FIG. 3, further details of memory controller 106 are shown. Column address 152 holds a column address; parity 163 produces a one-bit parity of column address 152. For example, if a particular value in column address 152 has an even number of bits, parity 163 outputs a "1". Row address 150 holds a row address. Multiplexer 175 selects either the output of column address 152 or the output of row address 150 and outputs the selection (column address or row address) to address 121, in a conventional manner where row address and column address are time multiplexed over address 121.

Bank address 155 addresses a particular memory bank on each memory chip (not shown) in each memory rank 113.

Current DRAM (dynamic random access memory) chips are configured to have eight banks, but more or fewer memory banks per memory chip are contemplated.

Controls 158 outputs RAS 123 which is active when row address 150 is selected by multiplexer 175 (typically a rise or a fall of RAS 123 occurs when a row address is valid on address 121). Similarly, controls 158 activate CAS 124 at a time when column address 152 is selected.

Controls 158 outputs ODT 126 which is used by ranks 113 for proper signal termination. Controls 158 outputs write enable 125 which tell memory unit 112 whether a read or a write is to occur.

Data register 151 contains data to be written to memory unit 112. Data register 151, for example, may contain 64 bits, 128 bits, or some other number of data bits to be written to memory unity 112. For exemplary purposes, data register 151 will be assumed to have 64 data bits. Data register 151 outputs functional data bits 141.

ECC (Error Checking and Correcting) unit 170 produces ECC bits 142, which, together with functional data bits 141 are written to memory unit 112 (FIG. 2). ECC bits 142 are typically eight bits when functional data bits 141 is sixty four bits. In an embodiment, ECC 170 generates a value to place on ECC bits 142 using all bits in functional data bits 141, the bit output by parity 163 (i.e., the parity generated from the value in column address 152), and an output of parity generator 156.

Parity generator 156 receives as inputs the value in row address 150, the value in bank address 155, and an output (encoded rank select 189) of multiplexer 191.

Multiplexer 191, during functional reads and writes, passes functional encoded rank select 186 to encoded rank select 189. In the example of FIG. 3, there are four rank selects; therefore the encoded rank select values are "00", "01", "10", and "11". Rank select values "00" and "11" have an even number of bits; rank select values "01" and "10" have an odd number of bits.

Decode 177 decodes the encoded rank select value output by encoded rank select 154 and outputs functional rank select 182. (e.g., "00" decodes to "0001" to activate rank select $130_0$ (FIG. 2) if functional rank select 182 is passed through multiplexer 190; "01" decodes to "0010" to activate rank select $130_1$ if functional rank select 182 is passed through multiplexer 190; "10" decodes to "0100" to activate rank select $130_2$ if functional rank select 182 is passed through multiplexer 190; "11" decodes to "1000" to activate rank select $130_3$ if functional rank select 182 is passed through multiplexer 190).

Initialization control 180 is used during initialization of memory 108 and provides a value on initialization rank select 183 that, when passed through multiplexer 190, will activate two of the four rank select 130 signals in FIG. 3. The two rank select signals activated have the same parity when encoded. That is, "0001" and "1000" (encoded values "00" and "11", which both have an even number of "1"s) are combined, and "1001" is driven on initialization rank select 183. When "1001" is driven on initialization rank select 183, "00" is driven on initialization encoded rank select 185. Alternately, "11" could be driven on initialization encoded rank select 185 instead of "00" since the number of "1"s is even in both cases.

Similarly, during initialization of the two remaining memory ranks 113, "0100" (encoded value "10") and "0010" (encoded value "01") are combined, the encoded values having an odd number of "1"s, and "0110" is driven onto initialization rank select 183. Initialization control drives "01" (or, alternatively "10", since "01" and "10" both have an odd number of "1"s) on initialization encoded rank select 185.

During initialization of memory, initialization control 180 activates initialization select 184, causing initialization encoded rank select 185 to be passed through multiplexer 191 on encoded rank select 189, and also causing initialization rank select 183 to be passed through multiplexer 190. When initialization select 184 is not active, the output of encoded rank select 154, functional encoded rank select 186 is passed through multiplexer 191 onto encoded rank select 189, and functional rank select 182 is passed through multiplexer 190.

Since the two "odd numbered" memory ranks 113 are initialized at the same time, and an initialization encoded rank select 185 value indicating "odd numbered memory ranks 113" is passed through multiplexer 191 to parity generator 156, correct ECC for both "odd numbered" memory ranks is written to both memory ranks 113 simultaneously on ECC bits 142. Similarly "even numbered memory ranks are initialized in parallel with correct ECC bits written to both "even numbered" memory ranks 113 simultaneously on ECC bits 142.

Correct ECC is required to be written to all memory ranks because the initialization data written to the memory ranks must be subsequently usable during functional reads and ECC checking is performed when those functional reads are made.

In the manner explained above, a memory unit 112 has four memory ranks 113. Each of the four memory ranks has an associated encoded rank select that is used in producing a value on ECC bits 142 as depicted in FIG. 3. Two encoded rank select values have an even number of "1"s, and two encoded rank select values have an odd number of "1"s. By initializing, in parallel, the two memory ranks 113 having associated encoded rank select values having an even number of "1", and by initializing, in parallel, the two memory ranks 113 having associated encoded rank select values having an odd number of "1"s, memory unit 112 can be initialized in half the time required to initialize memory unit 112, where the memory ranks 113 are initialized one at a time.

Values of the encoded rank selects that have an even number of "1"s have the same parity; similarly, values of the encoded rank selects that have an odd number of "1"s also have the same parity. A first encoded rank select value having an even number of "1"s has a different parity than a second encoded rank select value having an odd number of "1"s.

Functional encoded rank select 186 is selected by multiplexer 191 during functional reads and writes instead of functional rank select 182 as input to parity generator 156 because one and only one "1" exists at any given time on functional rank select 182, that is, functional rank select 182 always has an odd number of "1"s. By using functional encoded rank select 186, via parity generator 156, in ECC generation by ECC 170, improved reliability in computer system 100 is achieved.

Figure 4:
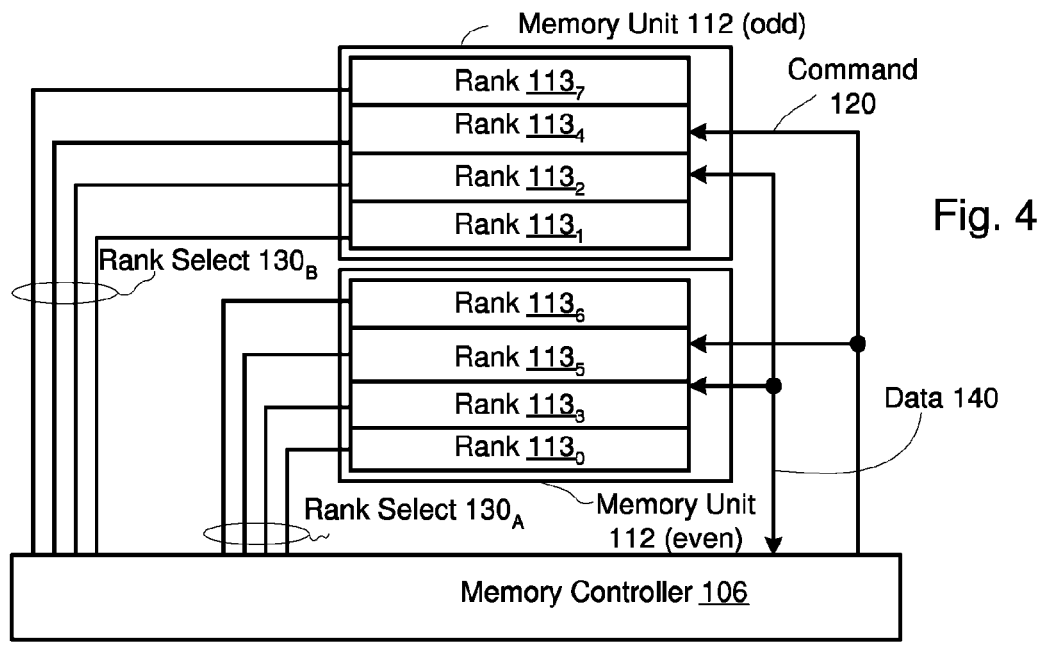
FIG. 4 is a block diagram of a memory controller and two memory units, a first memory unit configured to have odd parity in associated encoded rank select, and a second memory unit configured to have even parity in associated encoded rank select.
Figure 5:
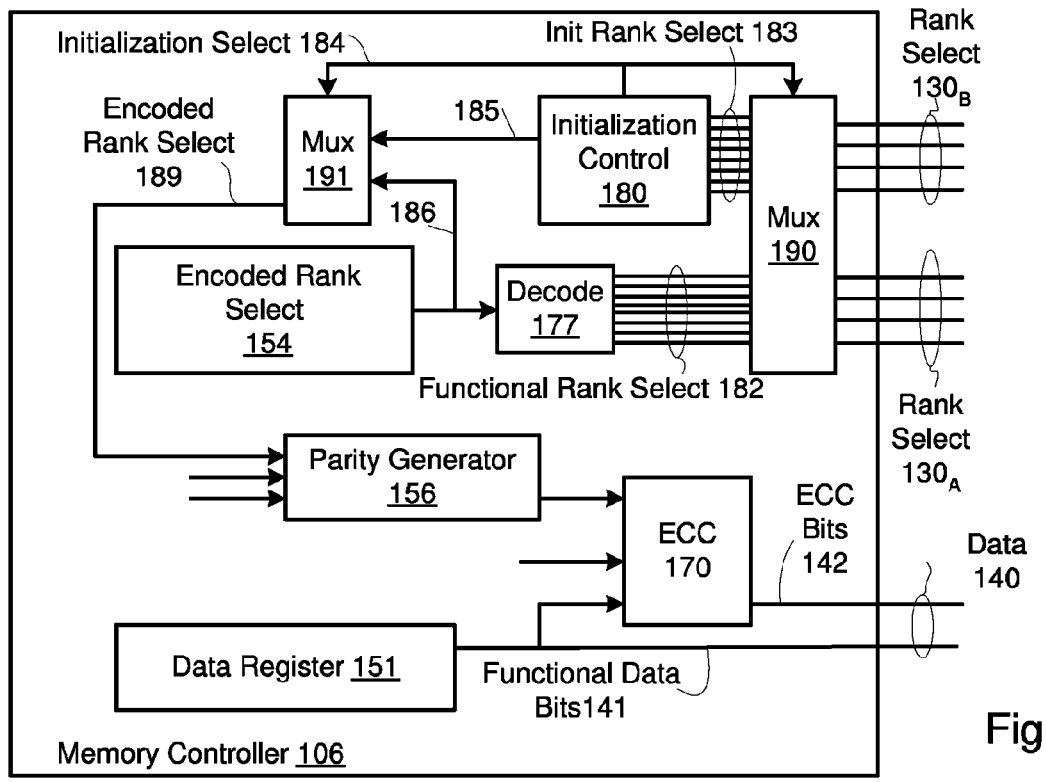
FIG. 5 is a block diagram a memory controller suitable to control the two memory elements of FIG. 4.

FIG. 4 shows memory controller 106 coupled to two memory units 112, shown as a first memory unit 112 (even), having memory ranks $113_0$, $113_3$, $113_5$ and $113_6$. Encoded rank select values that select ranks in the first memory unit 112 (even) have an even number of "1"s. (i.e., "000", "011", "101", and "110"), that is, they have the same parity. Note that, with a total of eight memory ranks, a three bit encoded rank select must be output by encoded rank select 154 (FIG. 5). Similarly, a second memory unit 112 (odd) has memory ranks $113_1$, $113_2$, $113_4$, and $113_7$, each of which is associated with an odd number of "1"s ("001", "010", "100", and "111") in the encoded rank select output by encoded rank select 154 (FIG. 5) and therefore have the same parity. Command 120 and data 140 in FIG. 4 are as described with reference to FIG. 3.

An eight bit rank select 130 in FIG. 5 is driven from memory controller 106, four of the rank selects, rank select 130$_A$, are driven to memory unit 112 (even), and four of the rank selects, rank select 130$_B$, are driven to memory unit 112 (odd). During functional reads and writes, only one of the eight decoded rank selects is active, causing a read or a write to one of the eight memory ranks 113. However, during initialization, all four rank selects in rank select 130$_A$ can be active at the same time when initializing memory unit 112 (even), and all four rank selects in rank select 130$_B$ can be active at the same time when initializing memory unit 112 (odd). Memory unit 112 (odd) can not be initialized at the same time that memory unit 112 (even) is initialized. Correct ECC will be written into each rank because initialization of all the ranks having an "even" number of "1"s in the associated encoded rank select are performed in parallel, and initialization of all the ranks having an "odd" number of "1"s in the associated encoded rank selects are performed in parallel.

FIG. 5 shows an embodiment of memory controller 106 suitable to perform initialization of a memory 108 (FIG. 1) having a first memory unit 112 (even) in which ranks are selected by an encoded rank select value having an even number of "1"s and a second memory unit 112 (odd) in which ranks are selected by an encoded rank select value having an odd number of "1"s. For simplicity, features common with memory controller 106 in FIG. 3 are not shown in FIG. 5 (e.g., parity 163, column address 152, row address 150, bank address 155 multiplexer 175, and controls 158).

The blocks shown in FIG. 5 have the same elements as corresponding elements in FIG. 3, differences between FIG. 3 and FIG. 5 being functional encoded rank select 186 has three bits in FIG. 5 and two bits in FIG. 3. In FIG. 5 Eight rank select signals are driven (four in rank select 130$_A$ and four in rank select 130$_B$ as described earlier). In FIG. 5, functional rank select 182 has eight bits, and initialization rank select 183 has eight bits in. Parity generator 156 receives three bits on encoded rank select 189 from multiplexer 191 (i.e., three functional encoded rank select bits from functional encoded rank select 186, or three bits of initialization encoded rank select 185 output by initialization control 180, depending on initialization select 184). Parity generator 156 in FIG. 5 also receives a bank address (shown in more detail in FIG. 3) and a row address (shown in more detail in FIG. 3) as indicated by simple arrows into parity generator 156 in FIG. 5. ECC 170 receives an input from parity generator 156, functional data bits 141, and a column address (shown by a simple arrow in FIG. 5; shown in more detail in FIG. 3).

Memory controller 106 in FIG. 5, during functional read and writes, activates only one rank select at a given time. That is, decode 177 decodes the three bit functional encoded rank 186 output by encoded rank select and activates one signal in functional rank select 182. Functional rank select 182 is selected by initialization select 184 for functional reads and writes, activating one rank select signal out of the eight rank select signals of rank select 130$_0$ and rank select 130$_1$.

Memory controller 106 in FIG. 5, during initialization of memory unit 112 (even) (FIG. 4) activates initialization select 184, all four rank select lines of rank select 130$_A$ (initialization rank select 183="00001111") are active, thereby initializing data in memory ranks 113$_0$, 113$_3$, 113$_5$, and 113$_6$ in parallel, and with the correct ECC for each memory rank 113. Upon completion of initialization of memory unit 112 (even), memory ranks 113$_1$, 113$_2$, 113$_4$, and 113$_7$ of memory unit 112 (odd) are initialized in parallel, with all four signals in rank select 130$_B$ being made active (i.e., initialization rank select 183 is "11110000"). While initialization of memory unit 112 (even) is described for exemplary purposes as occurring before initialization of memory unit 112 (odd), it is understood that initialization of memory unit 112 (odd) may occur first, or initialization writes may alternate between memory unit 112 (even) and memory unit 112 (odd).

During initialization of memory unit 112 (even), initialization control 180 drives initialization encoded rank select having three bits having an even number of "1"s on initialization encoded rank select 185. For example, "000", "011", "110" or "101". Because initialization select 184 is active during initialization, initialization encoded rank select 185 is selected by multiplexer 191. During initialization of memory unit 112 (odd), initialization control 180 passes three bits having an odd number of "1"s on initialization encoded rank select 185, for examples "001", "010", "100", or "111". Because initialization select 184 is active during initialization, initialization encoded rank select 185 is selected by multiplexer 191.

Initialization of memory unit 112 (even) may be completed by making a required number of initialization writes to initialize all storage in memory unit 112 (even) before initialization of memory unit 112 (odd) in a like manner. Alternatively, one or more initialization writes to memory unit 112 (even) may occur, followed by one or more initialization writes to memory unit 112 (odd). Alternating initialization writes between memory unit 112 (even) and memory unit 112 (odd) spreads out power dissipation in each of the memory units 112.

Because four memory ranks 113 are initialized in parallel in the configuration illustrated in FIG. 4 and FIG. 5, initialization of memory unit 112 (even) and memory unit 112 (odd) can be completed in one fourth the time needed for initialization one rank at a time.

The memory controllers shown in FIGS. 3 and 5 are both configured to initialize more than one memory rank at a time, first initializing a first set of memory ranks having an even number of "1"s in an encoded rank select value used to select memory ranks in the first set of memory ranks, then initializing memory ranks in a second set of memory ranks having an odd number of "1"s in an encoded rank select value used to select memory ranks in the second set of memory ranks.

Figure 6:
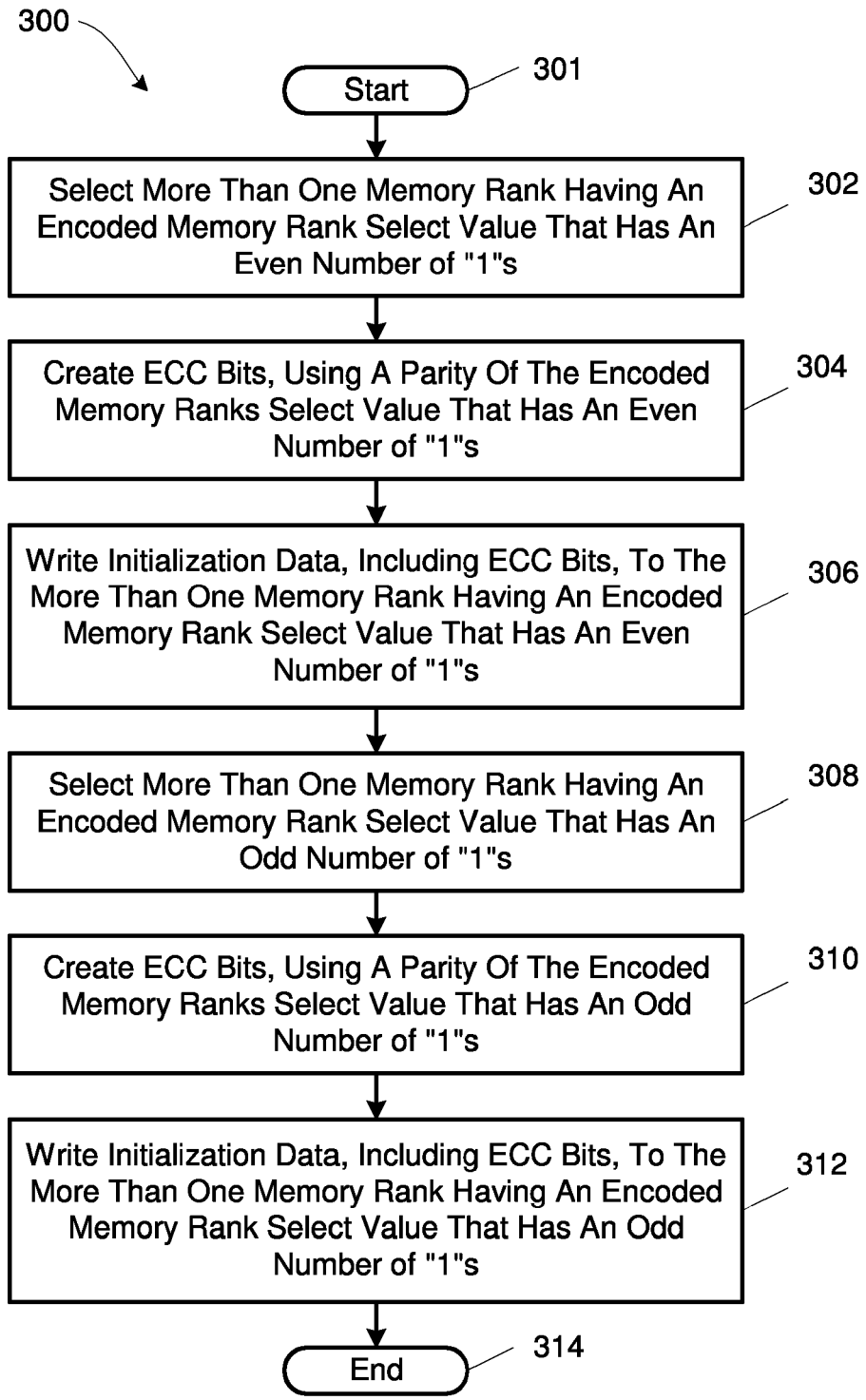
FIG. 6 is a flow chart of a method embodiment of the invention.

A method 300 embodiment of the invention is shown in FIG. 6 which will be described now with additional reference to apparatus embodiments above.

Method 300 provides for a faster initialization of a memory, with more than one memory rank being initialized at the same time. Each memory rank is selected by a rank select signal. An encoded rank select signal is used in a parity generator, with an output of the parity generator being an input to an ECC generator. ECC bits are stored, along with functional data, in memory ranks selected by rank select signals.

Method 300 begins at step 301. Step 301 activates an initialization mode of a memory controller, electronically enabling the memory controller to select more than one memory rank at once, while correctly providing ECC data bits that are written into the more than one memory rank selected at once. Referring to FIGS. 3 and 5, initialization select 184 is activated in step 301.

In step 302, the memory controller selects a first set of more than one memory rank by activating more than one rank select signal in a plurality of memory select signals. The more than one memory rank select signals all have an even number of "1"s in an encoded memory rank select signal, as explained earlier.

In step 304, a parity generator produces a parity bit appropriate in the implementation for data having an even number of "1"s in the encoded memory rank select signal. Other data, for example, a row select address and/or a bank address may also be input to the parity generator. ECC bits are generated, including an output of the parity generator. The ECC generator may also use functional data bits, column address bits, or other bits.

In step 306, initialization data, including functional data and ECC bits, are written to the selected memory ranks in parallel.

In step 308, the memory controller selects a second set of more than one memory rank by activating more than one memory rank select signal in a plurality of memory select signals. The more than one memory rank select signals all have an odd number of "1"s in an encoded memory rank select signal, as explained earlier.

In step 310, a parity generator produces a parity bit appropriate in the implementation for data having an odd number of "1"s in the encoded memory rank select signal. Other data, for example, a row select address and/or a bank address may also be input to the parity generator. ECC bits are generated, including an output of the parity generator. The ECC generator may also use functional data bits, column address bits, or other bits.

In step 312, initialization data, including functional data and ECC bits, are written to the selected memory ranks in parallel.

Step 314 ends method 300.

It is understood that initialization shown in method 300 may proceed in various orders. For example, initialization data may be written to memory ranks having odd numbers of "1"s in associated encoded memory rank select signals before initialization data is written to memory ranks having even numbers of "1"s in associated memory rank select signals. Alternatively, alternation between writing initialization data to memory ranks having odd numbers of "1"s in associated encoded memory rank select signals and memory ranks having even numbers of "1"s in associated encoded memory rank signals may be done.

What is claimed is:

1. A computer system comprising:
   a processor;
   a memory further comprising a first memory unit, the first memory unit further comprising more than one memory rank;
   a memory controller coupled to the processor and to the memory, the memory controller coupled to the memory unit with a rank select having a rank select signal unique to the each memory rank in the memory unit, the memory controller further comprising:
      a functional encoded rank select;
      an initialization encoded rank select;
      a multiplexer configured to select the functional encoded rank select or the initialization encoded ranks select and output an encoded rank select;
      a parity generator configured to generate a parity of the value of the encoded rank select;
      an initialization control configured to, during a memory initialization period:
         drive the initialization encoded rank select;
         cause the multiplexer to select the initialization encoded rank select; and
         cause a first rank select signal for a first memory rank and a second rank select signal for a second memory rank to be active at a particular time;
      the initialization control further configured, during functional reads and writes, to cause the multiplexer to select the functional encoded rank select;
      and
      an error checking and correcting (ECC) unit that receives the parity from the parity generator and which generates ECC bits that are stored in a memory rank having an active rank select signal.

2. The computer system of claim 1, wherein a functional encoded rank select value of the first memory rank and a functional encoded rank select value of the second memory rank have the same parity.

3. The computer system of claim 2, the ECC unit configured to produce a particular ECC bits value for memory ranks having the same parity of their respective encoded rank select values, other inputs to the ECC being the same.

4. The computer system of claim 3, the initialization control further configured to output an initialization rank select having a number of signals equal to a number of signals as the rank select, and further configured to drive the initialization rank select on to the rank select during the initialization period.

5. The computer system of claim 1, further comprising a second memory unit wherein all memory ranks in the first memory unit have encoded rank selects having an even number of "1"s and all memory ranks in the second memory unit have encoded rank selects having an odd number of "1"s.

6. The computer system of claim 5, wherein all memory ranks in the first memory unit receive an initialization write in parallel during a first interval during the initialization period, and all memory ranks in the second memory unit receive an initialization write in parallel during a second interval during the initialization period.

7. A method of initializing multiple ranks in a memory unit of a computer, the computer having a memory controller that uses a parity of an encoded rank select in generating ECC (Error Checking and Correction) bits during writes to a memory unit having a plurality of memory ranks, the method comprising:
   selecting, during a first interval in an initialization period, a first set of more than one memory ranks in a memory unit, each memory rank in the first set having an encoded rank select having an even number of "1"s;
   writing initialization data, including ECC bits, to the first set of more than one memory ranks in the memory unit;
   selecting, during a second interval in the initialization period, a second set of more than one memory ranks in a memory unit, each memory rank in the second set having an encoded rank select having an odd number of "1"s; and
   writing initialization data, including ECC bits, to the second set of more than one memory ranks in the memory unit.

8. The method of claim 7, further comprising:
   using a first initialization encoded rank select having an even number of "1"s to create the parity during the first interval; and
   using a second initialization encoded rank select having an odd number of "1"s to create the parity during the second interval.

9. The method of claim 8, further comprising, during functional writes, using a functional encoded rank select to create the parity.

10. The method of claim 9, further comprising checking of ECC by the memory controller on data read from the memory unit.

* * * * *